United States Patent
Lee et al.

(10) Patent No.: US 8,836,017 B2
(45) Date of Patent: Sep. 16, 2014

(54) SEMICONDUCTOR DEVICE AND FABRICATING METHOD THEREOF

(75) Inventors: Tsung-Hsiung Lee, Taoyuan County (TW); Shang-Hui Tu, Tainan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 274 days.

(21) Appl. No.: 13/426,931

(22) Filed: Mar. 22, 2012

(65) Prior Publication Data
US 2013/0175608 A1 Jul. 11, 2013

(30) Foreign Application Priority Data
Jan. 11, 2012 (TW) .................. 101101042 A

(51) Int. Cl.
*H01L 29/66* (2006.01)
*H01L 21/336* (2006.01)
(52) U.S. Cl.
USPC .... 257/329; 257/335; 257/343; 257/E29.257; 257/E21.418; 438/268
(58) Field of Classification Search
None
See application file for complete search history.

(56) References Cited

U.S. PATENT DOCUMENTS

| | | | |
|---|---|---|---|
| 5,572,048 A * | 11/1996 | Sugawara | 257/132 |
| 6,184,555 B1 * | 2/2001 | Tihanyi et al. | 257/342 |
| 6,534,830 B2 * | 3/2003 | Tihanyi et al. | 257/343 |
| 6,768,171 B2 * | 7/2004 | Disney | 257/342 |
| 6,803,626 B2 * | 10/2004 | Sapp et al. | 257/329 |
| 7,279,747 B2 * | 10/2007 | Ninomiya | 257/341 |
| 8,071,450 B2 * | 12/2011 | Chen | 438/269 |
| 8,390,060 B2 * | 3/2013 | Darwish et al. | 257/330 |
| 8,445,955 B2 * | 5/2013 | Cheng et al. | 257/329 |
| 8,643,089 B2 * | 2/2014 | Lee et al. | 257/329 |
| 8,716,111 B2 * | 5/2014 | Wang et al. | 438/478 |
| 8,772,868 B2 * | 7/2014 | Yedinak et al. | 257/341 |
| 2003/0094649 A1 * | 5/2003 | Hueting et al. | 257/328 |
| 2003/0132450 A1 * | 7/2003 | Minato et al. | 257/110 |
| 2007/0114599 A1 * | 5/2007 | Hshieh | 257/330 |

FOREIGN PATENT DOCUMENTS

| | | |
|---|---|---|
| JP | 2007-036213 A | 2/2007 |
| JP | 2012-060017 A | 3/2012 |

* cited by examiner

*Primary Examiner* — Hoang-Quan Ho
(74) *Attorney, Agent, or Firm* — Birch, Stewart, Kolasch & Birch, LLP

(57) ABSTRACT

A semiconductor device is provided. The semiconductor device includes a plurality of first epitaxial layers, a second epitaxial layer and a gate structure. The plurality of first epitaxial layers is stacked on a substrate and has a first conductivity type. Each first epitaxial layer includes at least one first doping region and at least one second doping region adjacent thereto. The first doping region has a second conductivity and the second doping region has the first conductivity type. The second epitaxial layer is disposed on the plurality of first epitaxial layers, having the first conductivity type. The second epitaxial layer has a trench therein and a third doping region having the second conductivity type is adjacent to a sidewall of the trench. The gate structure is disposed on the second epitaxial layer above the second doping region. A method of fabricating a semiconductor device is also disclosed.

28 Claims, 11 Drawing Sheets

SEMICONDUCTOR DEVICE AND FABRICATING METHOD THEREOF

CROSS REFERENCE TO RELATED APPLICATIONS

This Application claims priority of Taiwan Patent Application No. 101101042, filed on Jan. 11, 2012, the entirety of which is incorporated by reference herein.

BACKGROUND OF THE INVENTION

1. Field of the Invention

The invention relates to a semiconductor device, and in particular to a semiconductor device having a super junction structure and a fabricating method thereof.

2. Description of the Related Art

FIG. 1 illustrates a cross section of a conventional N-type vertical double-diffused MOSFET (VDMOSFET). The VDMOSFET 10 includes a semiconductor substrate and a gate structure thereon. The semiconductor substrate has an N-type epitaxial drift region 100 and a P-type base region 102 thereon to form a P-N junction. Moreover, a drain region 106 is under the N-type epitaxial drift region 100 and is connected to a drain electrode 114. The P-type base region 102 has a source region 104 therein and is connected to a source electrode 112. The gate structure is constituted by a gate dielectric layer 108 and a gate electrode 110 thereon.

In order to increase the withstand voltage of the P-N junction in the VDMOSFET 10, it is required to reduce the doping concentration of the N-type epitaxial drift region 100 and/or increase the thickness thereof. However, when the withstand voltage of the P-N junction is increased by such an approach, the turn on resistance (Ron) of the VDMOSFET 10 must be increased. Namely, the turn on resistance is limited by the doping concentration and the thickness of the N-type epitaxial drift region 100.

A VDMOSFET having a super junction structure may increase the doping concentration of the N-type epitaxial drift region so as to increase the withstand voltage of the P-N junction, while being capable of preventing the turn on resistance from increasing. However, the formation of the current super junction structure requires performing the epitaxial growth process many times, and the number of times thereof are based on the withstand voltage levels of the P-N junction. Therefore, the fabrication of such a super junction structure has drawbacks such as having complicated processes and high manufacturing costs.

Accordingly, there exists a need in the art for development of a semiconductor device having a super junction structure, capable of mitigating or eliminating the aforementioned problems.

BRIEF SUMMARY OF THE INVENTION

A detailed description is given in the following embodiments with reference to the accompanying drawings. Semiconductor devices and methods for fabricating the same are provided. An exemplary embodiment of a semiconductor device comprises a plurality of first epitaxial layers stacked on a substrate. The plurality of first epitaxial layers and the substrate have a first conductivity type. Each first epitaxial layer comprises at least one first doping region and at least one second doping region adjacent thereto. The first doping region has a second conductivity and the second doping region has the first conductivity type. A second epitaxial layer is disposed on the plurality of first epitaxial layers, having the first conductivity type. The second epitaxial layer has a trench therein to expose the first doping region thereunder. A third doping region is adjacent to a sidewall of the trench, having the second conductivity type. The second epitaxial layer and the first, second and third doping regions have a doping concentration greater than that of each first epitaxial layer. A gate structure is disposed on the second epitaxial layer above the second doping region.

An exemplary embodiment of a method of fabricating semiconductor device comprises forming a stack of a plurality of first epitaxial layers on a substrate and forming at least one first doping region and at least one second doping region adjacent to the first doping region in each first epitaxial layer. The plurality of first epitaxial layers, the substrate, and the second doping region have a first conductivity type and the first doping region has a second conductivity. A second epitaxial layer is formed on the plurality of first epitaxial layer. The second epitaxial layer has the first conductivity type. A trench is formed in the second epitaxial layer to expose the first doping region thereunder. A third doping region is formed adjacent to a sidewall of the trench. The third doping region has the second conductivity type. The second epitaxial layer and the first, second and third doping regions have a doping concentration greater than that of each first epitaxial layer. A gate structure is formed on the second epitaxial layer above the second doping region.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
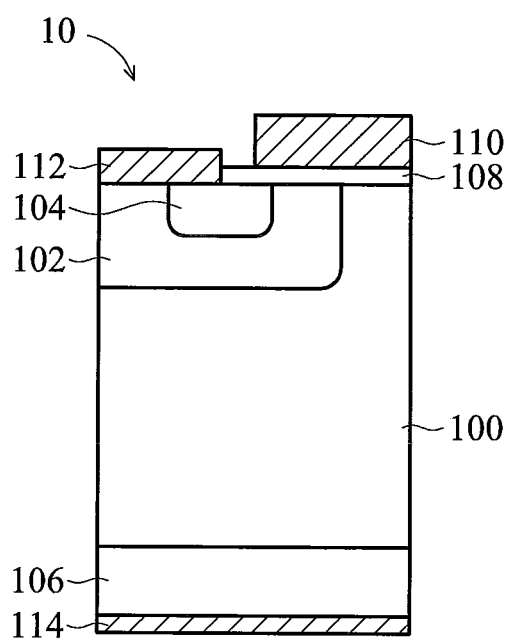
FIG. 1 is a cross section of a conventional N-type vertical double-diffused MOSFET (VDMOSFET).
Figure 2A:
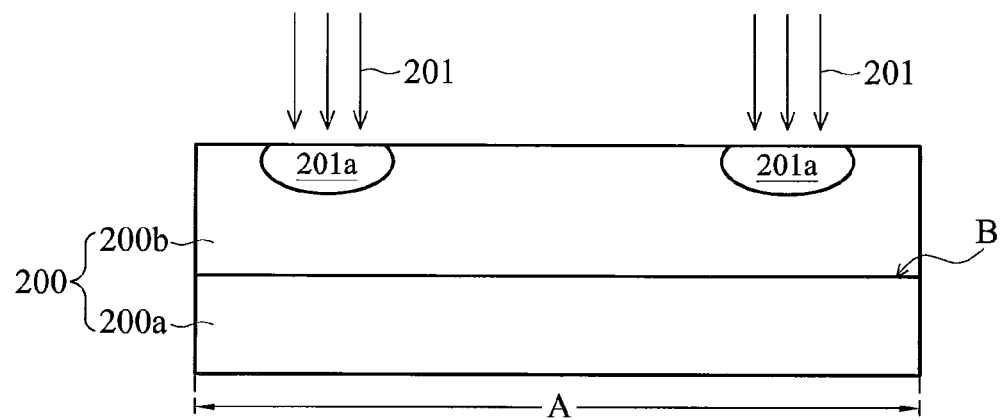
FIGS. 2A to 2G are cross sections of an embodiment of a method of fabricating a semiconductor device according to the invention.
Figure 2B:
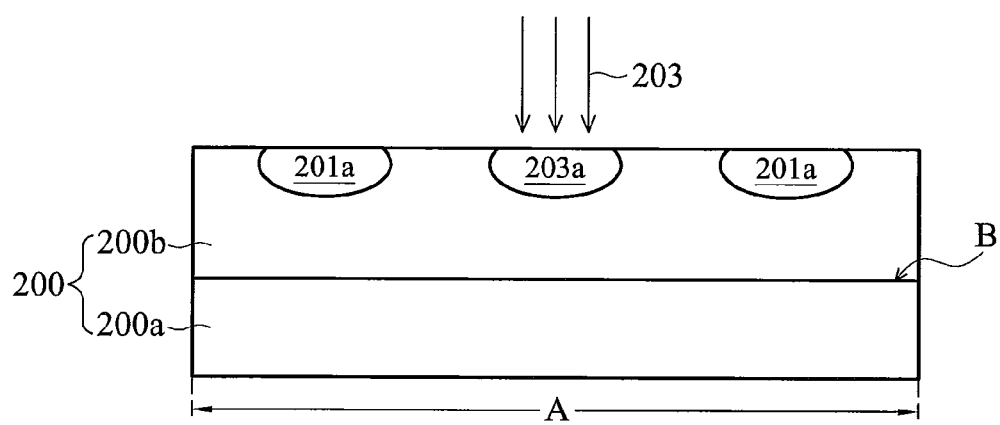
Figure 2C:
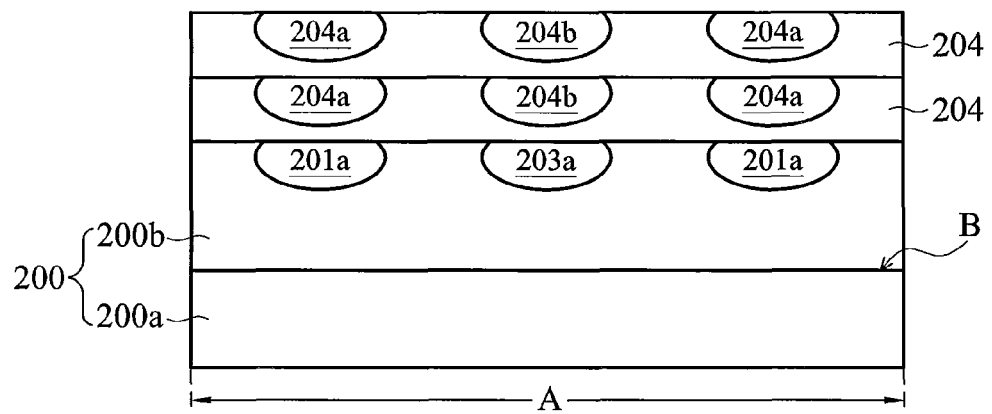
Figure 2D:
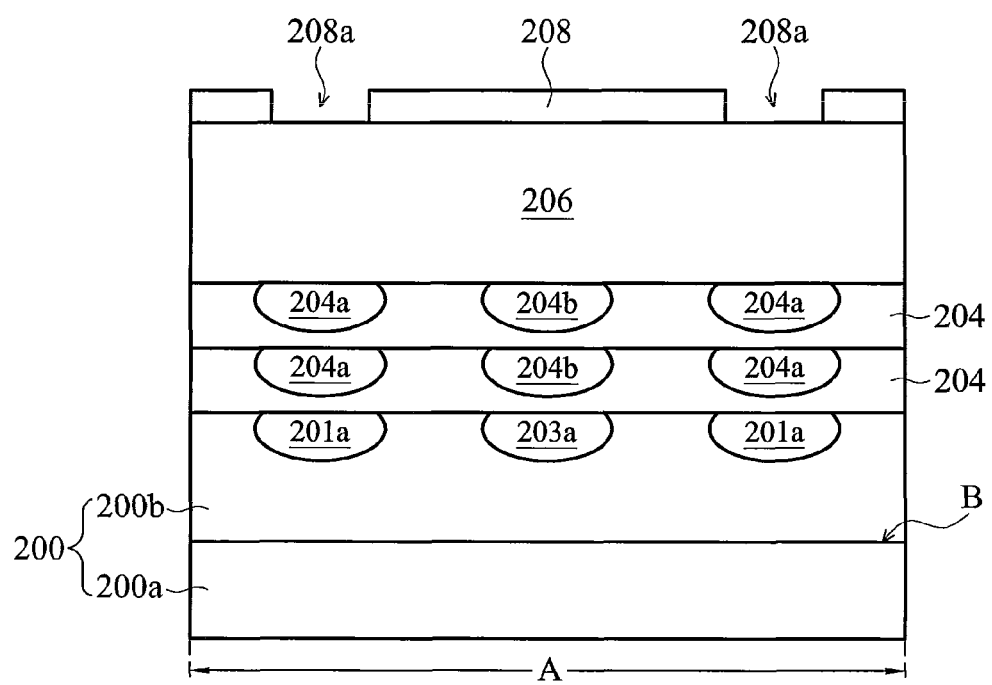
Figure 2E:
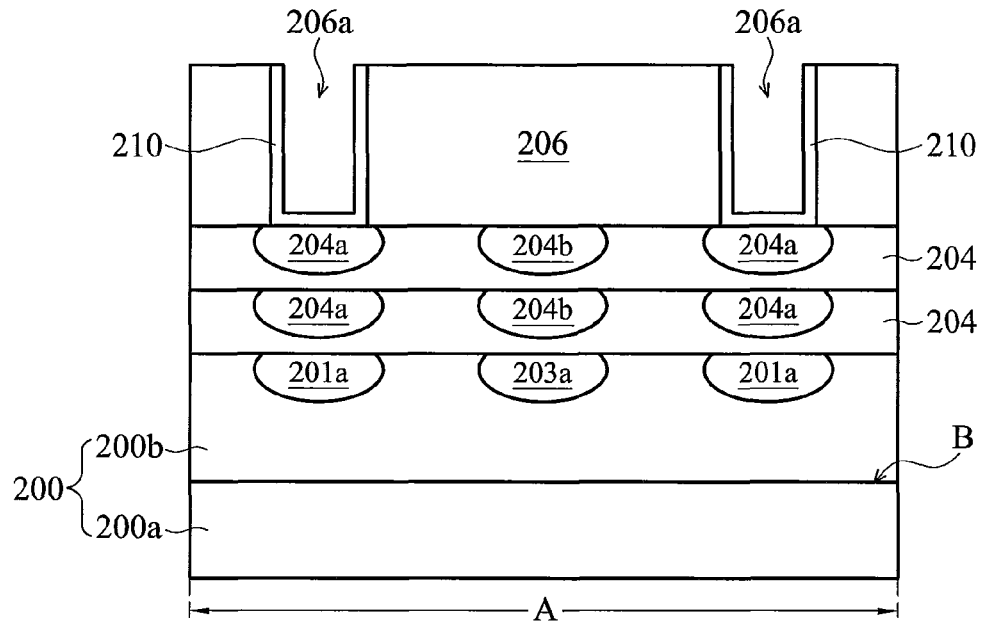
Figure 2F:
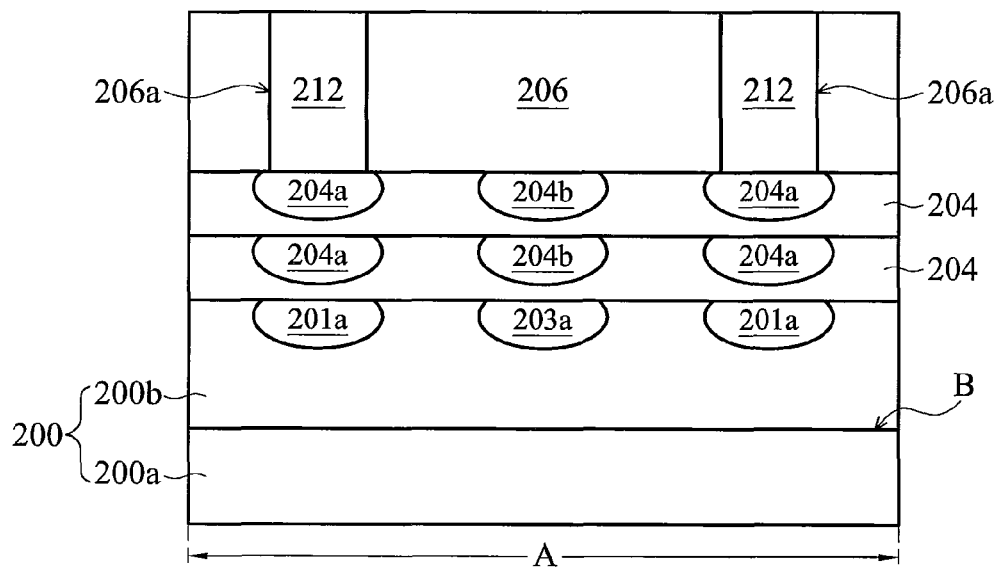
Figure 2G:
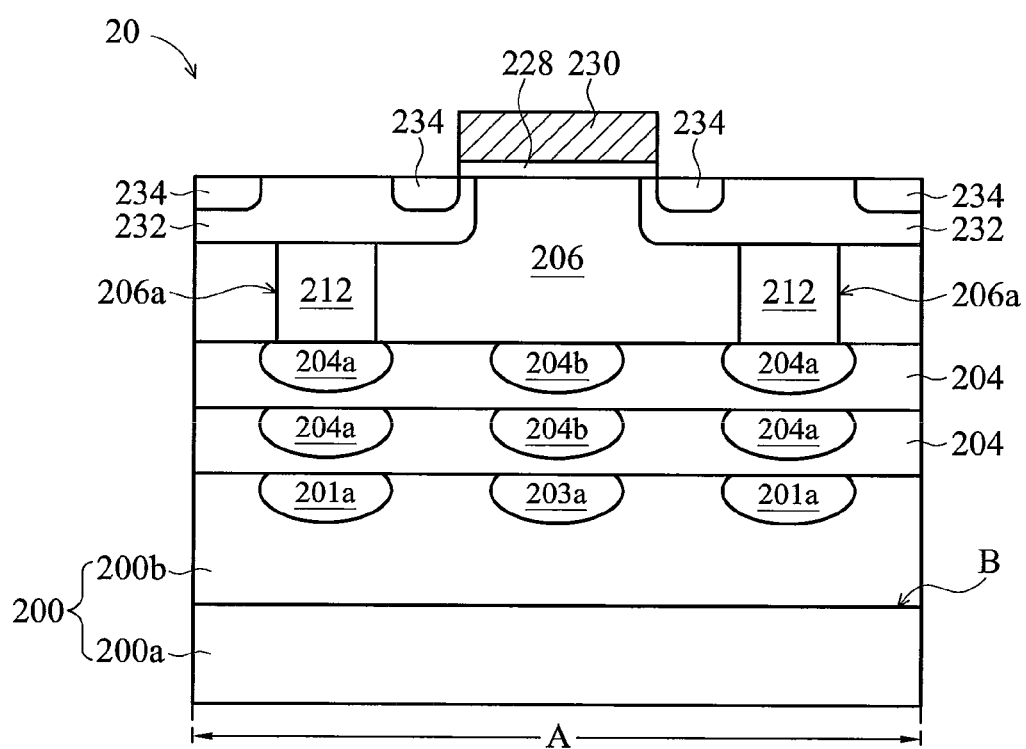

FIG. 2G illustrates a cross section of an embodiment of a semiconductor device according to the invention. In the embodiment, a semiconductor device 20 may comprise a VDMOSFET having a super junction structure. The semiconductor device 20 comprises a plurality of first epitaxial layers 204, a second epitaxial layer 206 and at least one gate structure. The plurality of first epitaxial layers 204 is stacked on a substrate 200, wherein each first epitaxial layers 204 and the substrate 200 have a first conductivity type. As shown in FIG. 2G, the substrate 200 may comprise an active region A and a termination region (not shown) encircling the active region A. In one embodiment, the active region A is provided for forming semiconductor elements/devices thereon, and the termination region is provided for isolation between the semiconductor elements/devices.

Each first epitaxial layer 204 may comprise a plurality of first doping regions 204a and a plurality of second doping regions 204b therein, wherein the pluralities of first and second doping regions 204a and 204b are in an alternate arrangement, such that each second doping region 204b is adjacent to at least one first doping region 204a or each first doping region 204a is adjacent to at least one second doping region 204b. Here, in order to simplify the diagram, only a second doping region 204b and two first doping regions 204a adjacent thereto are depicted. Moreover, the first doping region 204a has a second conductivity type different to the first conductivity type, and the second doping region 204b has the first conductivity type.

The second epitaxial layer 206 is disposed on the stack of the plurality of first epitaxial layers 204 and has the first conductivity type. The second epitaxial layer 206 comprises a plurality of trenches 206a, wherein each trench 206a corresponds to the underlying first doping region 204a and a bottom of each trench 206a exposes the corresponding first doping region 204a. Moreover, a plurality of third doping regions 212 corresponds to the plurality of trenches 206a, wherein each third doping region 212 is adjacent to a sidewall of the corresponding trench 206a. In the embodiment, the plurality of third doping regions 212 is correspondingly in the plurality of trenches 206a, wherein each third doping region 212 may comprise an epitaxial or polysilicon layer. Moreover, the second epitaxial layer 206, the first doping region 204a, the second doping region 204b and the third doping region 212 have a doping concentration greater than that of each first epitaxial layer 204.

In the embodiment, the substrate 200 comprises a fourth doping region 200a and a fifth doping region 200b on the fourth doping region 200a, wherein the fourth and fifth doping regions 200a and 200b have an interface B therebetween. In one embodiment, the fourth doping region 200a is formed of a semiconductor material and the fifth doping region 200b is formed of a doped epitaxial layer. In another embodiment, the fourth and fifth doping regions 200a and 200b with different doping concentrations are formed in the same semiconductor material substrate 200.

In the embodiment, the fourth and fifth doping regions 200a and 200b have the first type conductivity, wherein the fourth doping region 200a may be a heavily doped region and the fifth doping region 200b may be a lightly doped region. Moreover, the fifth doping region 200b may comprise pluralities of sixth and seventh doping regions 201a and 203a therein, wherein the pluralities of sixth and seventh doping regions 201a and 203a are in an alternate arrangement, such that each seventh doping region 203a is adjacent to at least one sixth doping region 201a or each sixth doping region 201a is adjacent to at least one seventh doping region 203a. Here, in order to simplify the diagram, only a seventh doping region 203a and two sixth doping regions 201a adjacent thereto are depicted.

In the embodiment, the plurality of sixth doping regions 201a corresponds to the plurality of first doping region 204a and the plurality of seventh doping regions 203a corresponds to the plurality of second doping region 204b. Moreover, the first epitaxial layer 204 may have a doping concentration substantially the same as that of the fifth doping region 200b. The second epitaxial layer 206, the first doping region 204a, the second doping region 204b, the third doping region 212, the sixth doping region 201a and the seventh doping region 203a have a doping concentration greater than that of the fifth doping region 200b and less than that of the fourth doping region 200a.

In the embodiment, the first conductivity type is N-type and the second conductivity type is P-type. In some embodiments, however, the first conductivity type may also be P-type and the second conductivity type may be N-type. As a result, the second and seventh doping regions 204b and 203a having the first conductivity type and the first and sixth doping regions 204a and 201a having the second conductivity type may form a super junction structure in the fifth doping region 200b and the first epitaxial layer 204. Moreover, the second epitaxial layer 206 having the first conductivity type and the third doping region 212 having the second conductivity type may also form a super junction structure.

A gate structure, which comprises a gate dielectric layer 228 and an overlying gate electrode 230, is disposed on the second epitaxial layer 206 and corresponds to the second doping region 204b in each first epitaxial layer 204. Moreover, a well region 232 having the second conductivity type is formed in an upper portion of each third doping region 212 and extends into the second epitaxial layer 206 outside of the trench 206a. A source region 234 having the first conductivity type is formed in each well region 232 on both sides of the gate structure to form a VDMOSFET with the gate structure and the fourth doping region (which serves as a drain region) 200a.

Figure 3A:
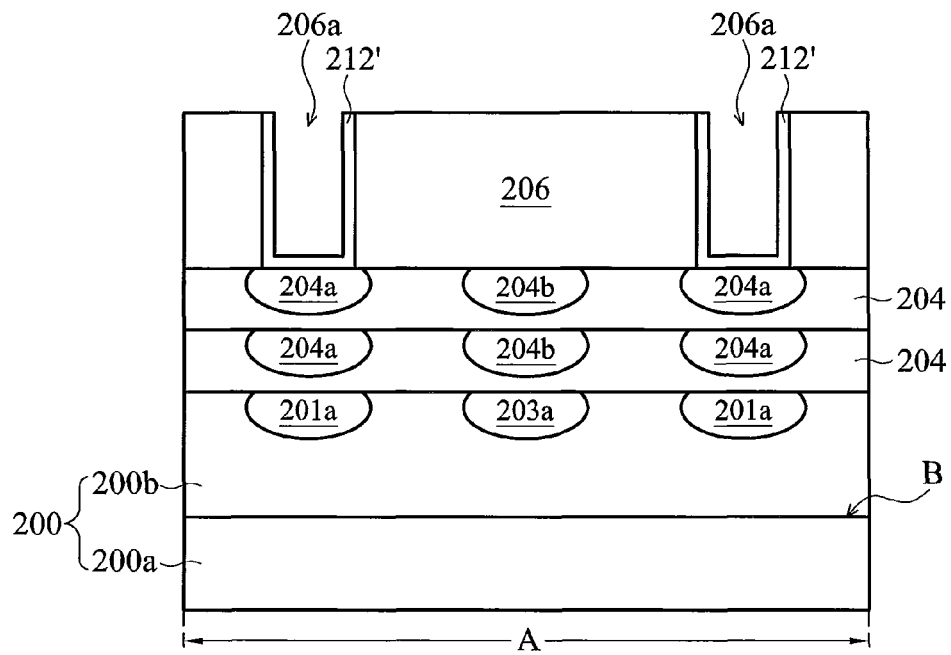
FIGS. 3A to 3C are cross sections of another embodiment of a method of fabricating a semiconductor device according to the invention.
Figure 3B:
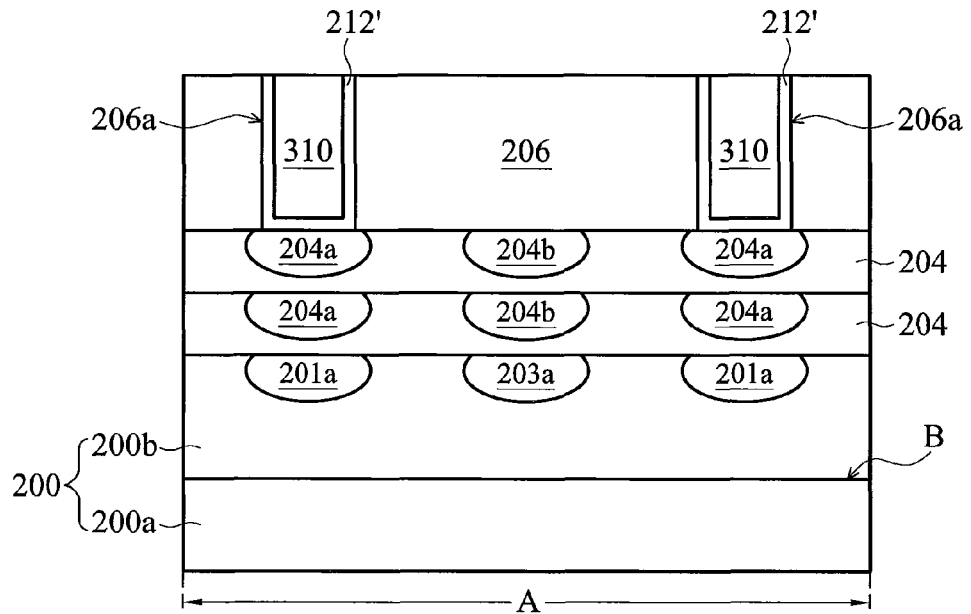
Figure 3C:
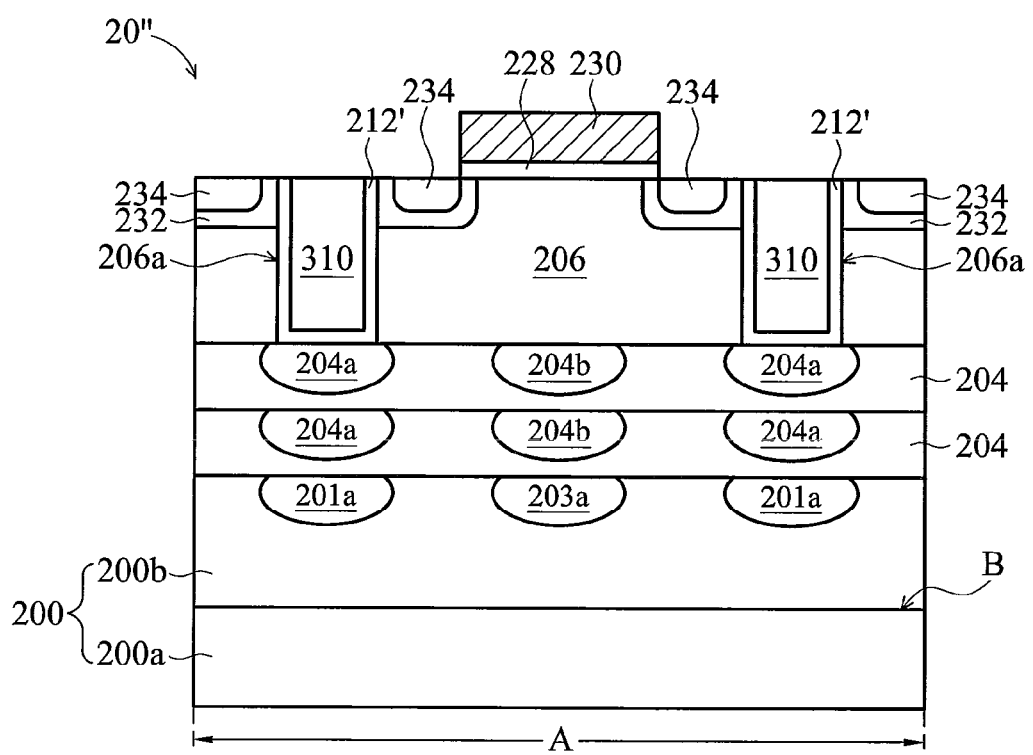

FIG. 3C illustrates a cross section of another embodiment of a semiconductor device according to the invention. Elements in FIG. 3C that are the same as those in FIG. 2G are labeled with the same reference numbers as in FIG. 2G and are not described again for brevity. In the embodiment, the semiconductor device 20' is similar as the semiconductor device 20 shown in FIG. 2G, wherein the difference is each third doping region 212', such as an epitaxial layer, is conformably disposed on a sidewall and a bottom of the corresponding trench 206a. Moreover, a dielectric material layer 310 is disposed in each trench 206a to fully be filled therein. In the embodiment, the dielectric material layer 310 may comprise silicon oxide or undoped polysilicon. Moreover, in the embodiment, the well region 232 is formed in the second epitaxial layer 206 outside of an upper portion of each third doping region 212'. The source region 234 having the first conductivity type is formed in each well region 232 on both sides of the gate structure to form a VDMOSFET with the gate structure and the fourth doping region (which serves as a drain region) 200a. The third doping region 212' may be formed by an epitaxial growth process.

Figure 4A:
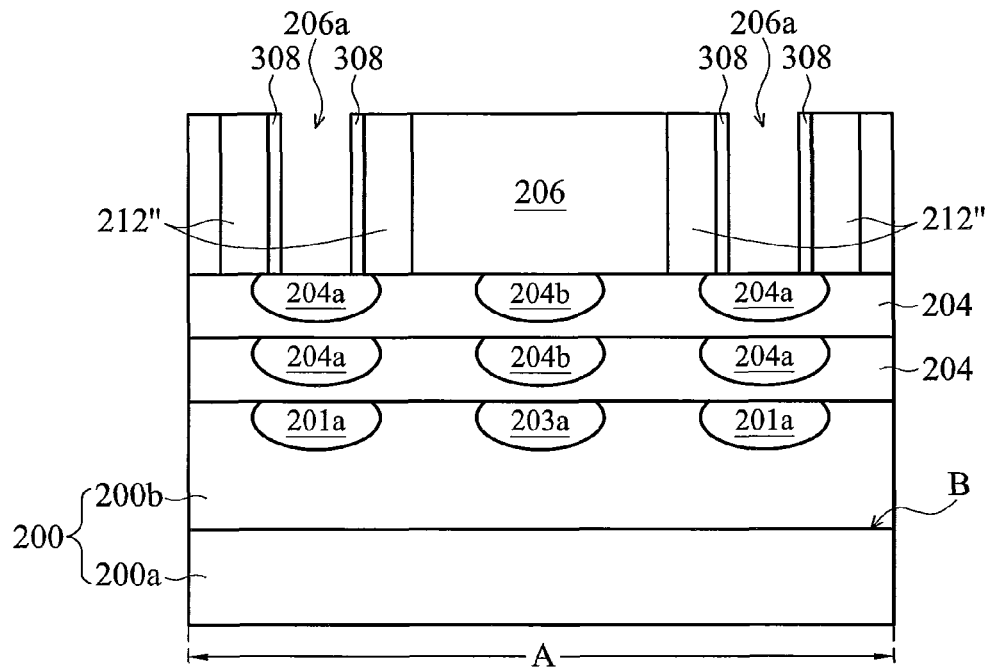
FIGS. 4A to 4C are cross sections of yet another embodiment of a method of fabricating a semiconductor device according to the invention.
Figure 4B:
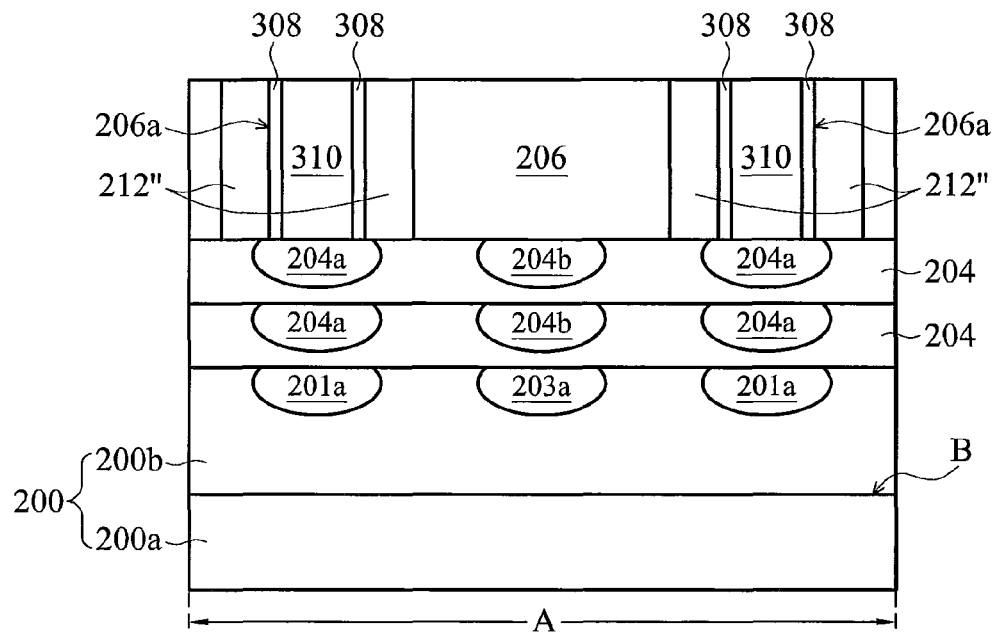
Figure 4C:
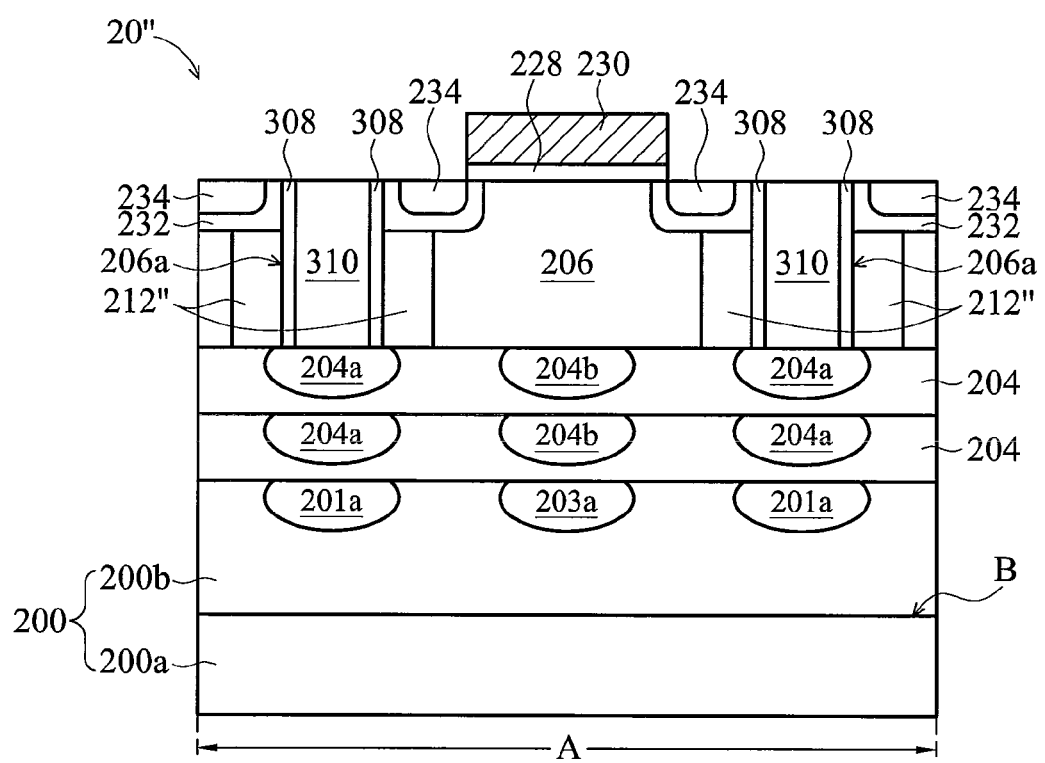

FIG. 4C illustrates a cross section of yet another embodiment of a semiconductor device according to the invention. Elements in FIG. 4C that are the same as those in FIG. 2G are labeled with the same reference numbers as in FIG. 2G and are not described again for brevity. In the embodiment, the semiconductor device 20" is similar as the semiconductor device 20 shown in FIG. 2G, wherein the difference is each third doping region 212" is in the second epitaxial layer 206 adjacent to the sidewall of each trench 206a. Moreover, each trench 206a comprises a dielectric material layer 310 and a doped layer 308 therein, wherein the doped layer 308 is disposed between the dielectric material layer 310 and the second epitaxial layer 206. In the embodiment, the dielectric material layer 310 may comprise silicon oxide or undoped polysilicon. Moreover, the third doping region 212" may be formed by performing a drive in process in the doped layer 308.

In the embodiment, the well region 232 is formed in an upper portion of each third doping region 212" and extends into the second epitaxial layer 206. The source region 234 having the first conductivity type is formed in each well region 232 on both sides of the gate structure to form a VDMOSFET with the gate structure and the fourth doping region (which serves as a drain region) 200a.

Figure 5A:
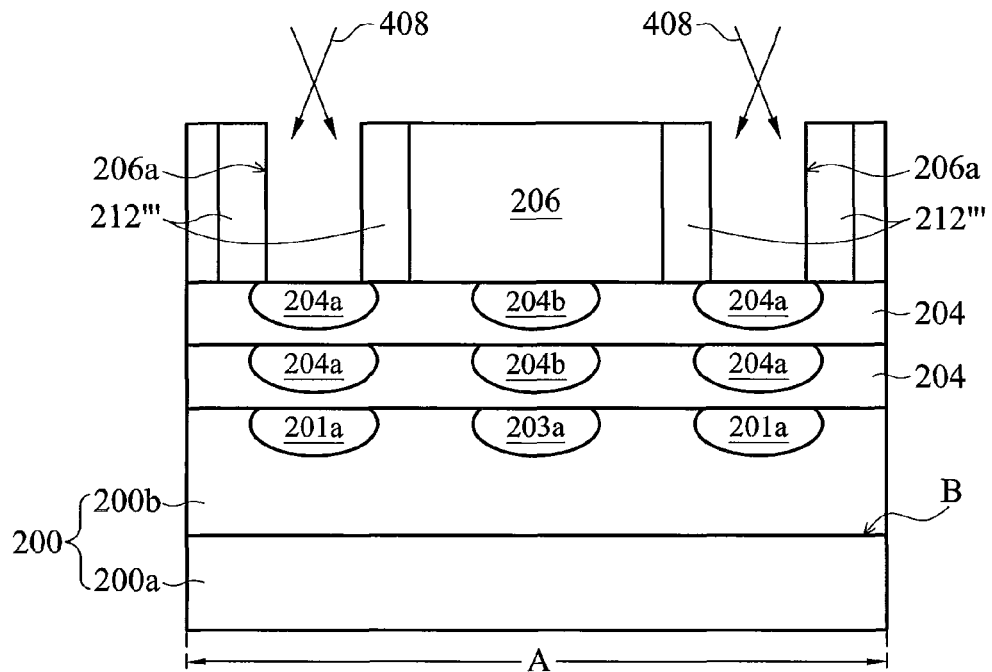
FIGS. 5A to 5C are cross sections of further another embodiment of a method of fabricating a semiconductor device according to the invention
Figure 5B:
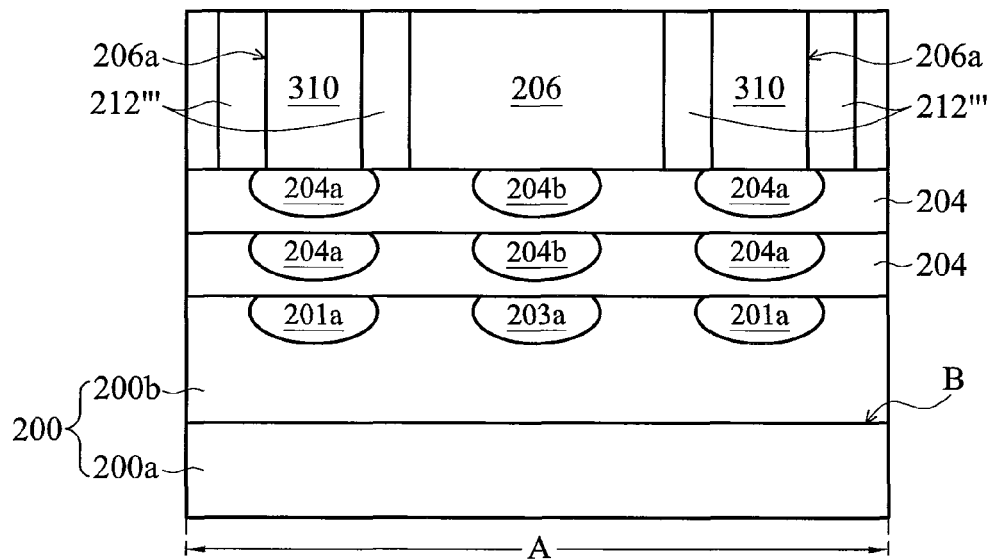
Figure 5C:
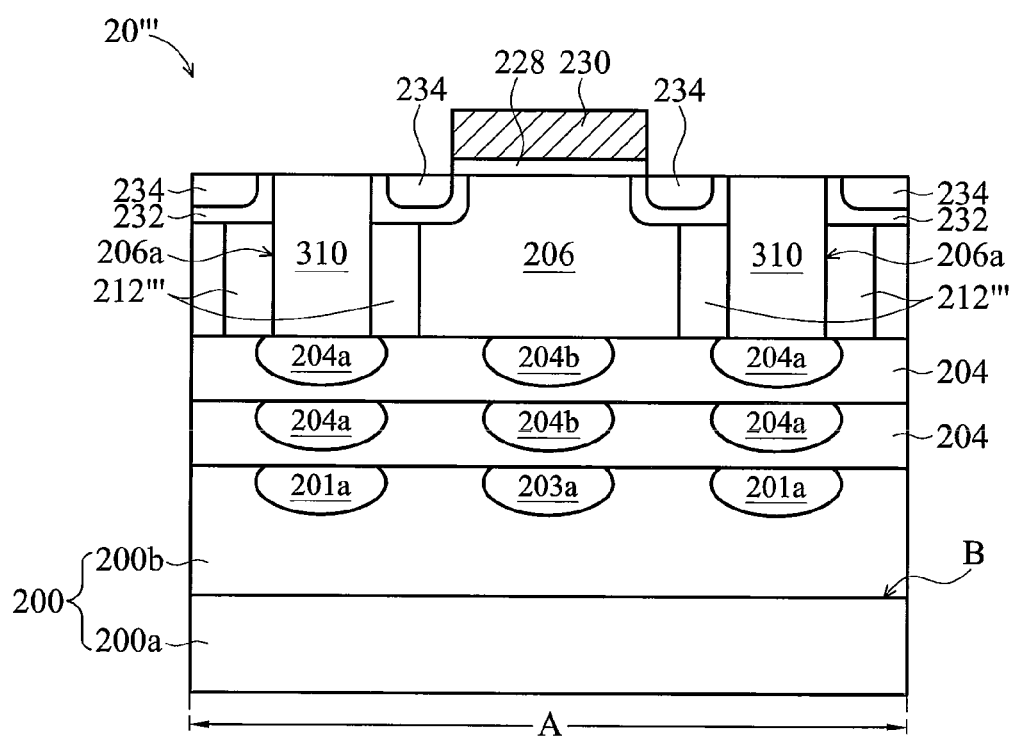

FIG. 5C illustrates a cross section of further another embodiment of a semiconductor device according to the invention. Elements in FIG. 5C that are the same as those in FIG. 4C are labeled with the same reference numbers as in FIG. 4C and are not described again for brevity. In the embodiment, the semiconductor device 20''' is similar as the semiconductor device 20'' shown in FIG. 4C, wherein the difference is each third doping region 212''' may be formed by performing a vapor phase doping or ion implantation process in the second epitaxial layer 206 through each trench 206a.

FIGS. 2A to 2G are cross sections of an embodiment of a method of fabricating a semiconductor device 20 according to the invention. Referring to FIG. 2A, a substrate 200 is provided. The substrate 200 comprises a fourth doping region 200a and an overlying fifth doping region 200b, wherein the fourth and fifth doping regions 200a and 200b have an interface B therebetween. The substrate 200 may comprise an active region A and a termination region (not shown) encircling the active region A. In one embodiment, the fourth doping region 200a is formed of a semiconductor material and the fifth doping region 200b is formed of a doped epitaxial layer on the semiconductor material (i.e., the fourth doping region 200a) by an epitaxial growth process. In another embodiment, different doping processes may be performed on the substrate 200 formed of a semiconductor material, thereby forming the fourth and fifth doping regions 200a and 200b with different doping concentrations therein, wherein the doping process for formation of the fourth doping region 200a may be performed after formation of a transistor structure thereafter. In the embodiment, the fourth and fifth doping regions 200a and 200b have a first type conductivity, wherein the fourth doping region 200a may be a heavily doped region and the fifth doping region 200b may be a lightly doped region.

Next, a doping process 201, such as an ion implantation process, is performed, thereby forming a plurality of sixth doping regions 201a having a second conductivity type in the fifth doping region 200b in the active region A, wherein the sixth doping region 201a has a doping concentration greater than that of the fifth doping region 200b and less than that of the fourth doping region 200a.

Referring to FIG. 2B, a doping process 203, such as an ion implantation process, is performed, thereby forming a plurality of seventh doping regions 203a having the first conductivity type in the fifth doping region 200b in the active region A, wherein the plurality of seventh doping regions 203a and the plurality of sixth doping regions 201a are in alternate arrangement. Here, in order to simplify the diagram, only a seventh doping region 203a and two sixth doping regions 201a adjacent thereto are depicted. The seventh doping region 203a has a doping concentration greater than that of the fifth doping region 200b and less than that of the fourth doping region 200a. In another embodiment, however, it is noted that the doping process 203 may be performed before performing the doping process 201.

Referring to FIG. 2C, a stack of a plurality of first epitaxial layers 204 is formed on the substrate 200, and pluralities of first and second doping regions 204a and 204b are formed in each first epitaxial layer 204. In the embodiment, the first epitaxial layer 204 has the first conductivity type and has a doping concentration substantially the same as that of the fifth doping region 200b. Moreover, the pluralities of first and second doping regions 204a and 204b are in alternate arrangement and respectively correspond to the pluralities of sixth and seventh doping regions 201a and 203a thereunder. Here, in order to simplify the diagram, only a second doping region 204b and two first doping regions 204a adjacent thereto are depicted. The first doping region 204a has the second conductivity type and the second doping region 204b has the first conductivity type. Moreover, the formation of the pluralities of first and second doping regions 204a and 204b may be similar or the same as that of the pluralities of sixth and seventh doping regions 201a and 203a, such that the first and second doping regions 204a and 204b have a doping concentration greater than that of the fifth doping region 200b and less than that of the fourth doping region 200a. It is noted that the number of the first epitaxial layers 204 may be adjusted by the design demands and is not limited to two layers (as shown in FIG. 2C).

Referring to FIG. 2D, a second epitaxial layer 206 having the first conductivity type is formed on the uppermost first epitaxial layer 204 by an epitaxial growth process, wherein the second epitaxial layer 206 has a doping concentration greater than that of the fifth doping region 200b and less than that of the fourth doping region 200a. A hard mask (HM) 208 is formed on the second epitaxial layer 206 in the active region A by, for example, a chemical vapor deposition (CVD) process, and thereafter lithography and etching processes are performed on the hard mask 208, thereby forming a plurality of openings 208a corresponding to the plurality of first doping regions 204a.

Referring to FIG. 2E, an anisotropic etching process is performed, so as to form a plurality of trenches 206a in the second epitaxial layer 206 under the plurality of openings 208a. In the embodiment, the plurality of trenches 206a exposes the underlying plurality of first doping regions 204a. In the embodiment, after removal of the hard mask 208, an insulating liner 210 is conformally formed on the sidewall and bottom of each trench 206a by a CVD or thermal oxidation process. The insulating liner 210 may be an oxide liner which is capable of reducing the stresses in the second epitaxial layer 206 and serving as a pre-implant oxide for a subsequent doping process to reduce the channel effect.

Referring to FIG. 2F, after removal of the insulating liner 210, a third doping region 212 having the second conductivity type is formed on a sidewall of each trench 206a. In one embodiment, an epitaxial layer having the second conductivity type is formed on the second epitaxial layer 206 and in each trench 206 by an epitaxial growth process. Thereafter, the epitaxial layer on the second epitaxial layer 206 may be removed by a polishing process, such as a chemical mechanical polishing (CMP) process. In another embodiment, a polysilicon layer having the second conductivity type is formed on the second epitaxial layer 206 and in each trench 206 by a CVD process. Thereafter, the polysilicon layer on the second epitaxial layer 206 may be removed by a polishing process, such as a CMP process.

In the embodiment, the second epitaxial layer 206, the first doping region 204a, the second doping region 204b and the third doping region 212 have a doping concentration greater than that of the first epitaxial layer 204. Moreover, the second epitaxial layer 206, the first doping region 204a, the second doping region 204b, the third doping region 212, the sixth doping region 201a and the seventh doping region 203a have a doping concentration greater than that of the fifth doping region 200b and less than that of the fourth doping region 200a.

In the embodiment, the first conductivity type is N-type and the second conductivity type is P-type. In another embodiment, however, the first conductivity type may be P-type and the second conductivity type may be N-type. As a result, the second and seventh doping regions 204b and 203a having the first conductivity type and the first and sixth doping regions 204a and 201a having the second conductivity type may form a super junction structure in the fifth doping region 200b and the first epitaxial layer 204. Moreover, the second epitaxial layer 206 having the first conductivity type and the third doping region 212 having the second conductivity type may also form a super junction structure.

Referring to FIG. 2G, a plurality of gate structures is formed on the second epitaxial layer 206 by the conventional MOS process, wherein each gate structure is on the second doping region 204b in the first epitaxial layer 204. Each gate structure may comprise a gate dielectric layer 228 and an overlying gate electrode 230. Moreover, a well region 232 having the second conductivity type is formed on an upper portion of each third doping region 212 and extends into the second epitaxial layer 206 outside of the third doping region 212. A source region 234 having the first conductivity type is formed in each well region 232 on both sides of the gate structure to complete the fabrication of the semiconductor device 20, wherein a VDMOSFET is constituted by the source region 234, the gate structure and the fourth doping region (which serves as a drain region) 200a.

FIGS. 3A to 3C are cross sections of another embodiment of a method of fabricating a semiconductor device according to the invention. Elements in FIGS. 3A to 3C that are the same as those in FIGS. 2A to 2G are labeled with the same reference numbers as in FIGS. 2A to 2G and are not described again for brevity. Referring to FIG. 3A, a structure as shown in FIG. 2E is formed by performing the fabrication steps as shown in FIGS. 2A to 2E. Next, after removal of the insulating liner 210, a third doping region 212', such as an epitaxial layer, is conformably formed on a sidewall and a bottom of each trench 206a by an epitaxial growth process. The third doping region 212' has the second conductivity type.

Referring to FIG. 3B, a dielectric material layer 310 is filled into each trench 206a. For example, the dielectric material layer 310, such as silicon oxide or undoped polysilicon, is formed on the second epitaxial layer 206 and in each trench 206a, such that the third epitaxial layer 212' in the trench 206a is between the dielectric material layer 310 and the second epitaxial layer 206. Thereafter, the dielectric material layer 310 on the second epitaxial layer 206 is removed by a CMP process, such that the third epitaxial layer 212' remaining in the trench 206a is between the dielectric material layer 310 and the second epitaxial layer 206.

Referring to FIG. 3C, a gate structure is formed on the second epitaxial layer 206 above the second doping region 204b in the first epitaxial layer 204 by the conventional MOS process. The gate structure may comprise a gate dielectric layer 228 and an overlying gate electrode 230. Moreover, a well region 232 having the second conductivity type is formed in the second epitaxial layer 206 on an upper portion of each third doping region 212'. A source region 234 having the first conductivity type is formed in each well region 232 on both sides of the gate structure to complete the fabrication of the semiconductor device 20', wherein a VDMOSFET is constituted by the source region 234, the gate structure and the fourth doping region (which serves as a drain region) 200a.

FIGS. 4A to 4C are cross sections of yet another embodiment of a method of fabricating a semiconductor device according to the invention. Elements in FIGS. 4A to 4C that are the same as those in FIGS. 2A to 2G are labeled with the same reference numbers as in FIGS. 2A to 2G and are not described again for brevity. Referring to FIG. 4A, a structure as shown in FIG. 2E is formed by performing the fabrication steps as shown in FIGS. 2A to 2E. Next, after removal of the insulating liner 210, a doping layer 308, such as a doped silicate glass, is formed on a sidewall of each trench 206a. The doping layer 308 has the second conductivity type. Thereafter, a drive in process is performed in the doping layer 308, thereby forming a third doping region 212" in the second epitaxial layer 206 outside of the trench 206a.

Referring to FIG. 4B, a dielectric material layer 310 is filled into each trench 206a. For example, the dielectric material layer 310, such as silicon oxide or undoped polysilicon, is formed on the second epitaxial layer 206 and in each trench 206a, such that the doping layer 308 in the trench 206a is between the dielectric material layer 310 and the second epitaxial layer 206. Thereafter, the dielectric material layer 310 on the second epitaxial layer 206 is removed by a CMP process.

Referring to FIG. 4C, a gate structure is formed on the second epitaxial layer 206 above the second doping region 204b in the first epitaxial layer 204 by the conventional MOS process. The gate structure may comprise a gate dielectric layer 228 and an overlying gate electrode 230. Moreover, a well region 232 having the second conductivity type is formed in an upper portion of each third doping region 212" and extends into the second epitaxial layer 206 outside of the third doping region 212". A source region 234 having the first conductivity type is formed in each well region 232 on both sides of the gate structure to complete the fabrication of the semiconductor device 20", wherein a VDMOSFET is constituted by the source region 234, the gate structure and the fourth doping region (which serves as a drain region) 200a.

FIGS. 5A to 5C are cross sections of yet another embodiment of a method of fabricating a semiconductor device according to the invention. Elements in FIGS. 5A to 5C that are the same as those in FIGS. 2A to 2G and 4A to 4C are labeled with the same reference numbers as in FIGS. 2A to 2G and 4A to 4C and are not described again for brevity. Referring to FIG. 5A, a structure as shown in FIG. 2E is formed by performing the fabrication steps as shown in FIGS. 2A to 2E. Next, after removal of the insulating liner 210, a doping process 408, such as a vapor phase doping or ion implantation process, is performed in the second epitaxial layer 206 through each trench 206a, thereby forming a third doping region 212' in the second epitaxial layer 206 adjacent to a sidewall of each trench 206a.

Thereafter, a dielectric material layer 310 is filled into each trench 206a (as shown in FIG. 5B) by performing the fabrication steps as shown in FIGS. 4B to 4C. As shown in FIG. 5C, a gate structure (which may comprise a gate dielectric layer 228 and an overlying gate electrode 230) is formed on the second epitaxial layer 206 above the second doping region 204b in the first epitaxial layer 204. Moreover, a well region 232 having the second conductivity type is formed in an upper portion of each third doping region 212'" and extends into the second epitaxial layer 206 outside of the third doping region 212'". A source region 234 having the first conductivity type is formed in each well region 232 on both sides of the gate structure to complete the fabrication of the semiconductor device 20'", wherein a VDMOSFET is constituted by the source region 234, the gate structure and the fourth doping region (which serves as a drain region) 200a.

According to the aforementioned embodiments, since the charge balance can be accomplished by controlling the doping concentrations of the N-type and P-type regions in the super junction structure that is formed by the first doping region 204a, the second doping region 204b, the sixth doping region 201a and seventh 203a, the super junction structure can be formed in the lightly doped region (i.e., the first epitaxial layer 204 and the fifth doping region 200b) to increase the withstand voltage of the P-N junction and prevent the turn on resistance from increasing.

Moreover, according to the aforementioned embodiments, since an additional super junction structure may be formed in the second epitaxial layer 206 on the first epitaxial layer 204, the number of the first epitaxial layers 204 can be reduced, thereby simplifying the processes and reducing the manufacturing costs.

Additionally, according to the aforementioned embodiments, since the first epitaxial layer 204 has super junction structures therein, the withstand voltage of the P-N junction can further be increased without increasing the depth of the plurality of trenches in the second epitaxial layer, and the process difficulty from the etching of deep trenches can be eliminated.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a plurality of first epitaxial layers stacked on a substrate, wherein the plurality of first epitaxial layers and the substrate have a first conductivity type, each of first epitaxial layer comprises at least one first doping region and at least one second doping region adjacent thereto, the first doping region has a second conductivity, and the second doping region has the first conductivity type;
a second epitaxial layer disposed on the plurality of first epitaxial layers, having the first conductivity type, wherein the second epitaxial layer has a trench therein to expose the first doping region thereunder;
a third doping region adjacent to a sidewall of the trench, having the second conductivity type, wherein the second epitaxial layer and the first, second and third doping regions have a doping concentration greater than that of each first epitaxial layer; and
a gate structure disposed on the second epitaxial layer above the second doping region.

2. The semiconductor device of claim 1, wherein the substrate comprises a fourth doping region and an overlying fifth doping region, wherein the fifth doping region comprises at least one sixth doping region and at least one seventh doping region, wherein the sixth doping region corresponds to the first doping region and the seventh doping region is adjacent thereto and corresponds to the second doping region and wherein the fourth, fifth, and seventh have the first conductivity type and the sixth doping region has the second conductivity type.

3. The semiconductor device of claim 2, wherein the second epitaxial layer and the first, second, third, sixth, and seventh doping regions have a doping concentration greater than that of the fifth doping region and less than that of the fourth doping region.

4. The semiconductor device of claim 2, wherein the fifth doping region comprises an epitaxial layer.

5. The semiconductor device of claim 1, wherein the first conductivity type is N-type and the second conductivity type is P-type.

6. The semiconductor device of claim 1, wherein third doping region is in the trench.

7. The semiconductor device of claim 6, wherein third doping region comprises an epitaxial or polysilicon layer.

8. The semiconductor device of claim 6, wherein the third doping region comprises an epitaxial layer and is conformably disposed on a sidewall and a bottom of the trench.

9. The semiconductor device of claim 8, further comprising a dielectric material layer disposed in the trench.

10. The semiconductor device of claim 9, wherein the dielectric material layer comprises silicon oxide or undoped polysilicon.

11. The semiconductor device of claim 1, wherein the third doping region is in the second epitaxial layer.

12. The semiconductor device of claim 11, further comprising a dielectric material layer disposed in the trench.

13. The semiconductor device of claim 12, wherein the dielectric material layer comprises silicon oxide or undoped polysilicon.

14. The semiconductor device of claim 12, further comprising a doping layer disposed in the trench and between the dielectric material layer and the second epitaxial layer.

15. A method of fabricating semiconductor device, comprising:
forming a stack of a plurality of first epitaxial layers on a substrate and forming at least one first doping region and at least one second doping region adjacent to the first doping region in each first epitaxial layer, wherein the plurality of first epitaxial layers, the substrate, and the second doping region have a first conductivity type and the first doping region has a second conductivity;
forming a second epitaxial layer on the plurality of first epitaxial layers, wherein the second epitaxial layer has the first conductivity type;
forming a trench in the second epitaxial layer to expose the first doping region thereunder;
forming a third doping region adjacent to a sidewall of the trench, wherein the third doping region has the second conductivity type, and wherein the second epitaxial layer and the first, second and third doping regions have a doping concentration greater than that of each first epitaxial layer; and
forming a gate structure on the second epitaxial layer above the second doping region.

16. The method of claim 15, wherein the substrate comprises a fourth doping region and an overlying fifth doping region, wherein the fifth doping region comprises at least one sixth doping region and at least one seventh doping region, wherein the sixth doping region corresponds to the first doping region and the seventh doping region is adjacent thereto and corresponds to the second doping region and wherein the fourth, fifth, and seventh have the first conductivity type and the sixth doping region has the second conductivity type.

17. The method of claim 16, wherein the second epitaxial layer and the first, second, third, sixth, and seventh doping regions have a doping concentration greater than that of the fifth doping region and less than that of the fourth doping region.

18. The method of claim 16, wherein the fifth doping region comprises an epitaxial layer.

19. The method of claim 15, wherein the first conductivity type is N-type and the second conductivity type is P-type.

20. The method of claim 15, wherein the formation of the third doping region comprises filling the trench with an epitaxial or polysilicon layer.

21. The method of claim 15, wherein the formation of the third doping region comprises conformably forming an epitaxial layer on a sidewall and a bottom of the trench.

22. The method of claim 21, further comprising filling the trench with a dielectric material layer.

23. The method of claim 22, wherein the dielectric material layer comprises silicon oxide or undoped polysilicon.

24. The method of claim 15, wherein the formation of the third doping region comprises:
    forming a doping layer on the sidewall of the trench, wherein the doping layer has the second conductivity type; and
    performing a drive in process in the doping layer to form the third doping region in the second epitaxial layer.

25. The method of claim 24, further comprising forming a dielectric material layer in the trench, such that the doping layer is between the dielectric material layer and the second epitaxial layer.

26. The method of claim 15, wherein the formation of the third doping region comprises performing a vapor phase doping or ion implantation process in the second epitaxial layer through the trench to form the third doping region in the second epitaxial layer.

27. The method of claim 26, further comprising forming a dielectric material layer in the trench.

28. The method of claim 15, further comprising forming an insulating liner in the trench before forming the third doping region.

* * * * *